United States Patent [19]

Frindle et al.

[11] Patent Number: 5,880,718
[45] Date of Patent: Mar. 9, 1999

[54] CAPACITIVE TOUCH DETECTION

[75] Inventors: Paul Anthony Frindle; John W. East, both of Witney; Simon Irving Harrison, Stanton Harcourt, all of England

[73] Assignees: Sony Corporation, Tokyo, Japan; Sony United Kingdom Limited, Weybridge, England

[21] Appl. No.: 520,565

[22] Filed: Aug. 28, 1995

[30] Foreign Application Priority Data

Sep. 15, 1994 [GB] United Kingdom .................... 9418615

[51] Int. Cl.$^6$ ........................................ G09G 5/00
[52] U.S. Cl. ............................................ 345/174; 341/33
[58] Field of Search ...................... 345/174, 173, 345/175, 177, 178; 341/33, 22, 34, 26, 29; 178/18, 19

[56] References Cited

U.S. PATENT DOCUMENTS

| 3,971,013 | 7/1976 | Challoner ................................. 345/174 |
| 4,175,239 | 11/1979 | Sandler ..................................... 341/33 |
| 4,291,303 | 9/1981 | Cutler . | |
| 4,550,310 | 10/1985 | Yamaguchi ............................... 341/33 |
| 4,635,288 | 1/1987 | Stadius . | |
| 4,736,191 | 4/1988 | Matzke et al. . | |
| 5,122,720 | 6/1992 | Martinson et al. . | |
| 5,233,666 | 8/1993 | Deveau . | |
| 5,293,102 | 3/1994 | Martinson et al. . | |

FOREIGN PATENT DOCUMENTS

| 0 097 498 | 1/1984 | European Pat. Off. . |
| 2 037 435 | 7/1980 | United Kingdom . |
| 2 241 064 | 8/1991 | United Kingdom . |
| 2 265 720 | 10/1993 | United Kingdom . |

Primary Examiner—Regina Liang
Attorney, Agent, or Firm—Frommer Lawrence & Haug, LLP; William S. Frommer

[57] ABSTRACT

A capacitive touch detection system, which can be used to inhibit motorized faders in an audio mixing system, includes touch detection circuits each having a respective conductive area for touch determination by detection of increased capacitance at the conductive area. The touch detection circuits are operable during predetermined active periods initiated by a clock generator which activates a pulse generator to produce an enable pulse EP1 for one detection circuit. The trailing edge of that enable pulse EP1 generates a non-overlapping enable pulse EP2 for the next detection circuit, and the process continues so that no more than one detection circuit is active at any time. This minimizes interaction between detection circuits if more than one conductive area is touched simultaneously.

6 Claims, 3 Drawing Sheets

CAPACITIVE TOUCH DETECTION

BACKGROUND OF THE INVENTION

1. Field of the Invention

This invention relates to capacitive touch detection such as in a system having capacitive touch buttons or knobs which respond to finger contact.

2. Description of the Prior Art

Various types of touch contact systems utilise the fact that the human body has a degree of capacitance to ground. Typically, since there will be some stray capacitance in the system even when the button is not being touched, touch detection is generally achieved by virtue of a detected capacitance being greater than a certain threshold, this threshold being sufficiently higher than the expected stray capacitance. A problem arises in systems where it is possible or even necessary for more than one button to be touched simultaneously. This has the effect of "sharing" the capacitance of the human body amongst the detection circuits associated with the buttons being touched. Accordingly, it is possible for the reduced capacitance (by virtue of the sharing effect) being below the threshold so that there is no touch detection. The effectiveness of such a system is thus dependent on the number of buttons being touched.

One example of a system in which the problem may arise involves signal mixing consoles such as audio mixing consoles which may be provided with motorized faders (potentiometers controlling the volume or other signal level). The motorized faders can automatically be set to predetermined levels by virtue of the motor drive. If the operator should then wish to adjust a fader manually, it is necessary to provide some means of detecting when this is being done, thereby preventing the motor acting against the operator when such detection has taken place. A capacitive detection technique has been used for this purpose. The faders have electrically conducting control knobs which are electrically charged by the detection circuit. When a finger is placed on a control knob, the change in capacitance of the control knob is detected by the detection circuit and the fader motor is inhibited. Even although it is known to provide a separate capacitance detector for each control knob, the above capacitance-sharing effect can still lead to lack of detection if, as is common in audio mixing applications, the operator is touching more than one fader at the same time. It can be possible to design detection circuits which operate reasonably reliably if two faders are touched simultaneously, but when three or more faders are touched, the circuits become unreliable. If, in order to overcome this difficulty, the sensitivity of the detection circuits is increased (i.e. the capacitance threshold is lowered), this tends to cause spurious inhibiting of the fader motors since the stray capacitance of the circuit will be much closer to the threshold and only a slight increase will trigger the motor inhibiting circuit.

Another problem with many existing touch detection circuits is their relative complexity. Such circuits are sometimes designed to respond to signal phase changes caused by the increased capacitance resulting from touch contact, and these circuits can be complex and hence expensive, which is a significant disadvantage if the particular application requires a large number of such detection circuits.

It has been proposed for audio mixing consoles to have a relatively small number of faders and control knobs (for controlling gain, equalization, audio processing and the like) in order to control a much larger number of audio channels; for example, one set of controls can be used to control up to eight different channels. This is achieved by the use of assignable controls, so that a control knob or fader can be temporarily assigned to a particular channel to make an adjustment, and subsequently used to make other adjustments to other channels, previous adjustment values being stored by the equipment and applied to the corresponding channels. In particular, a single set of equalization and processing controls may be shared between a number of channel faders. Whereas this saves on the number of control knobs required on the mixing console, and thus reduces the size and complexity of the console (which is a particular advantage in consoles having a large number of channels to be mixed), it can lead to operator confusion as to which channel is being controlled at any particular time, and also the operator may be adjusting the gain of one channel while the equalization controls are assigned to another channel.

SUMMARY OF THE INVENTION

It is an object of the invention to provide a capacitive touch detection system in which interaction between individual detection circuits associated with corresponding conductive areas is minimized.

It is another object of the invention to provide a capacitive touch detection circuit which is less complex and expensive than those of the prior art, such as phase change detection circuits.

It is a further object of the invention to provide a multi-channel signal mixing console in which temporarily assigned controls can be identified and utilized easily.

According to one aspect of the invention there is provided a capacitive touch detection system comprising a plurality of touch detection circuits each associated with a respective conductive area for detection of increased capacitance at the conductive area, wherein the touch detection circuits are operable during predetermined active periods, and wherein a timing circuit is provided for generating non-overlapping active periods for the timing circuits such that no more than one detection circuit is active at any time, thereby minimizing interaction between the detection circuits if more than one conductive area should be touched simultaneously.

According to another aspect of the invention there is provided a capacitive touch detection circuit comprising a switching means in a conductive path including a resistance and a conductive area across a voltage source, a threshold circuit for determining whether the voltage at the conductive area is below a threshold value, and means for receiving an enable pulse, the switching means being turned off by the enable pulse allowing the voltage at the conductive area to rise during the enable pulse such that, only if the contact area is not being touched, the voltage will rise above the threshold value.

According to a further aspect of the invention there is provided a multi-channel signal mixing console comprising a plurality of groups of controls each including a motorized fader, such that each group of controls can be assigned by an input means to particular signal channels, each motorized fader including a touch detection circuit, wherein upon detection of touch of a motorized fader, the other controls in the group associated with that fader are assigned to the channel represented by that fader.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
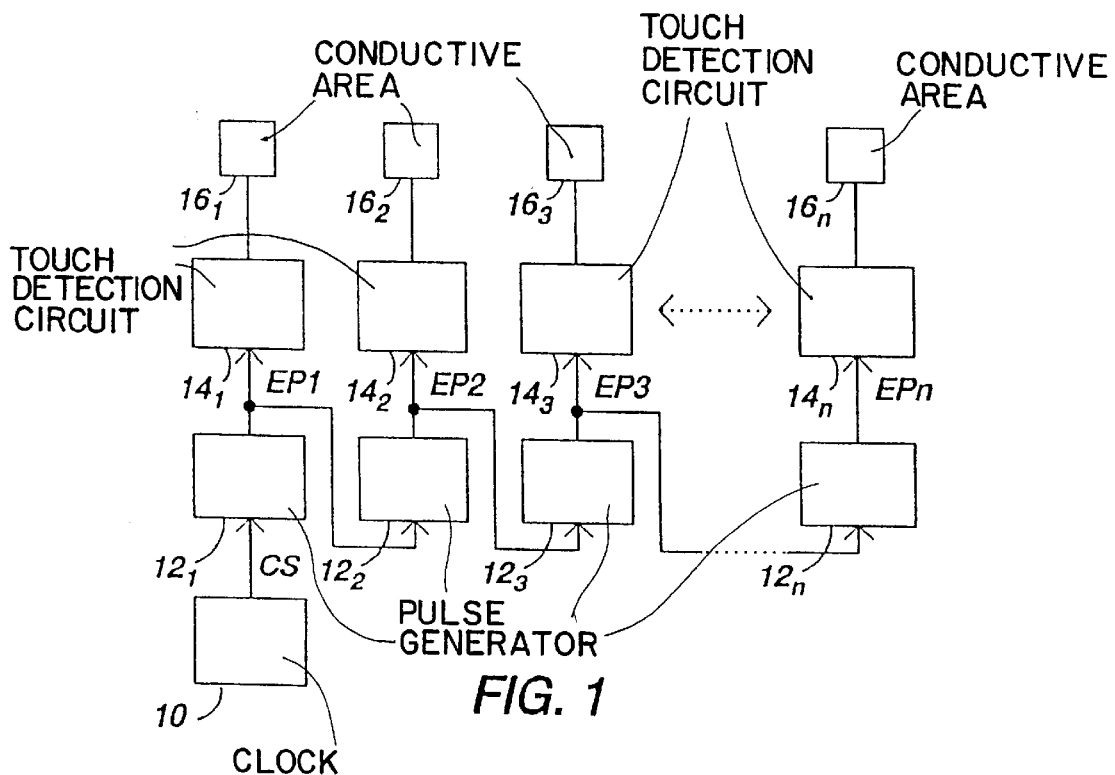
FIG. 1 is a schematic circuit diagram of a touch detection system according to one embodiment of the invention.

Referring to FIG. 1, a touch detection system includes an initial excitation clock 10 for overall timing control. A clock signal CS from the clock 10 is applied to a first one $12_1$ of a group of pulse generators $12_1$ to $12_n$. The first pulse generator $12_1$ applies an enable pulse EP1 to a first one $14_1$ of a group of touch detection circuits $14_1$ to $14_n$. The touch detection circuits may be part of a signal mixing console in which a detection circuit is provided for each conductive fader knob, as will be later described. The touch detection circuits $14_1$ to $14_n$ respond to changes in capacitance, caused by touching, on respective conductive areas $16_1$ to $16_n$.

The enable pulse EP1 from the first pulse generator $12_1$ is also applied to an input of the second pulse generator $12_2$ which in turn provides an enable pulse EP2 for its detection circuit $14_2$ and for the next pulse generator $12_3$. This continues along the line of detection circuits in similar manner until the final detection circuit $14_n$.

Referring to the timing chart of FIG. 2, the operation of the detection system of FIG. 1 will be explained. Each detection circuit is operative to detect capacitance on its conductive area for a short period set by its enable pulse. As will be seen from FIG. 2, the enable pulses occur sequentially such that the detection circuits operate sequentially. Thus the problem of capacitance sharing arising from multiple finger contact with simultaneous detection does not arise.

Figure 2:
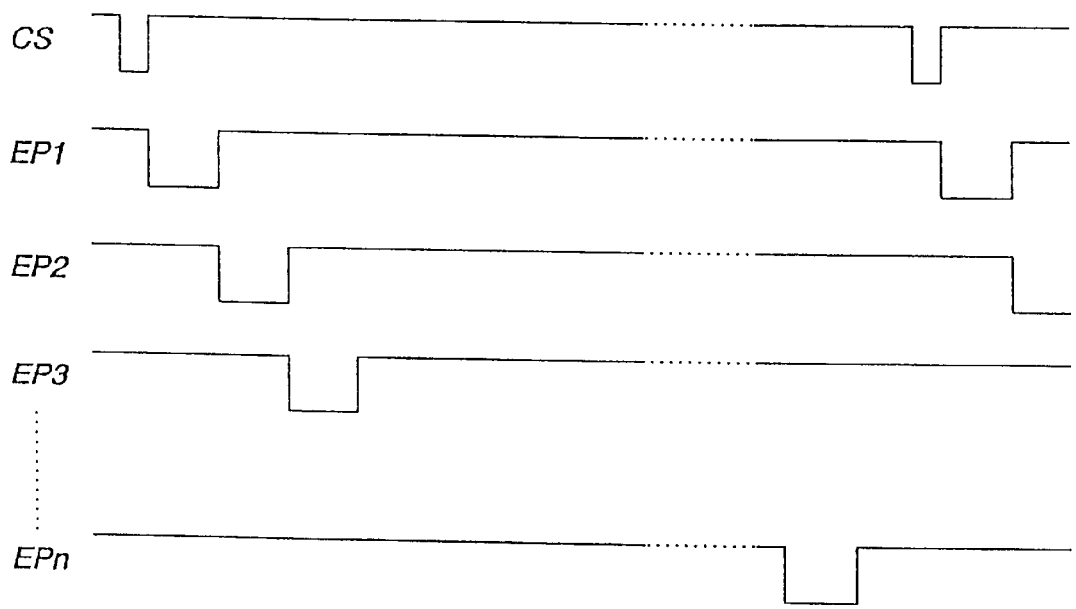
FIG. 2 is a timing chart showing the relative timings of enable pulses applied to individual detection circuits within the system of FIG. 1.

In FIG. 2, the clock 10 generates the clock signal CS which is applied to the pulse generator $12_1$. The pulse generator $12_1$ produces an enable pulse EP1 of fixed width in response to the rising edge (i.e. trailing edge) of the clock signal CS. The enable pulse EP1 activates touch detection of the circuit $14_1$. The rising edge of the enable pulse EP1 also causes the next pulse generator $12_2$ to produce an enable pulse EP2 of similar pulse width for activating the next detection circuit $14_2$. This process continues along the system until the last detection circuit $14_n$ receives its enable pulse $EP_n$. The pulse width of each enable pulse and the duration between the clock signals CS is set, bearing in mind the total number of detection circuits, to ensure that a full detection cycle of all circuits is completed before the next clock signal CS is generated. Thus, for example, in a typical system having 48 detection circuits, an overall duration between clock signals of about 5 ms will allow each enable pulse to last about 100 μs.

Thus it will be seen that there is no overlap of detection between the circuits $14_1$ to $14_n$ and so no adverse capacitance sharing effects will arise.

The above-described pulse enable timing scheme is only one possible example. In alternative arrangements, separately timed pulses could be sent to each detection circuit from a central timing control, or the final enable pulse $EP_n$ could be made to resume the detection cycle. Any such arrangement is possible as long as it provides separate detection times for the individual detection circuits.

Figure 3:
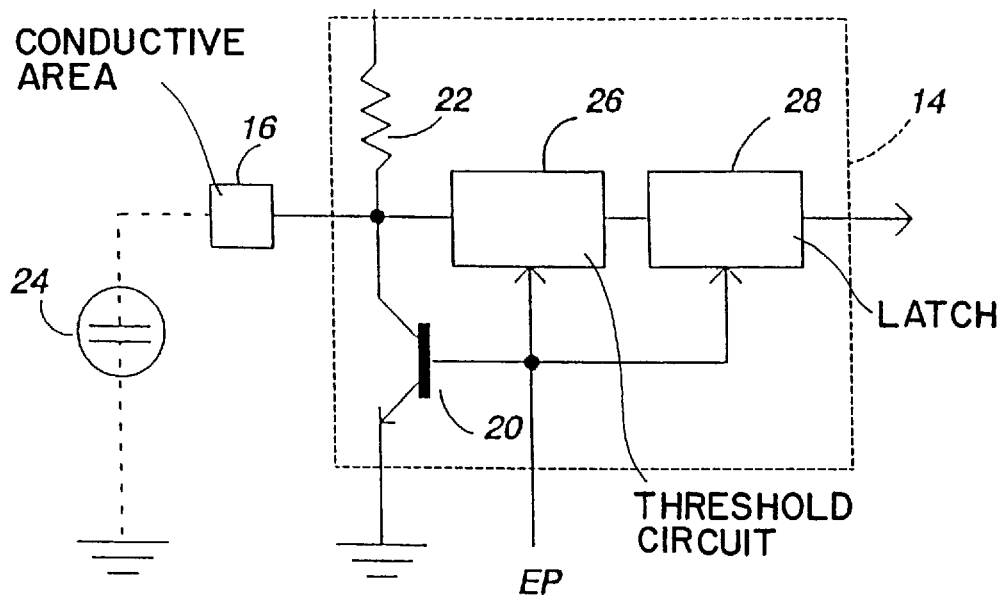
FIG. 3 is a block diagram of a particular detection circuit which may be used within the system of FIG. 1.

FIG. 3 shows one example of a touch detection circuit 14 which can be used in the system of FIG. 1. The circuit 14 includes a switching transistor 20, the base of which is connected to receive the enable pulse EP from its pulse generator 12 (FIG. 1). The switched path of the transistor 20 includes a resistor 22 between supply voltage V and the collector of the transistor 20, the emitter being connected to ground. The conductive area 16 is connected to the junction between the resistor 22 and the transistor 20. In an audio mixing console, the conductive area 16 will be the fader control knob. An operator 24 is shown schematically as a capacitance between the conductive area 16 and ground. The conductive area 16 is also connected to a threshold circuit 26 which is in turn connected to a latch 28. The enable pulse is also supplied to the threshold circuit 26 and the latch 28.

Figure 4:
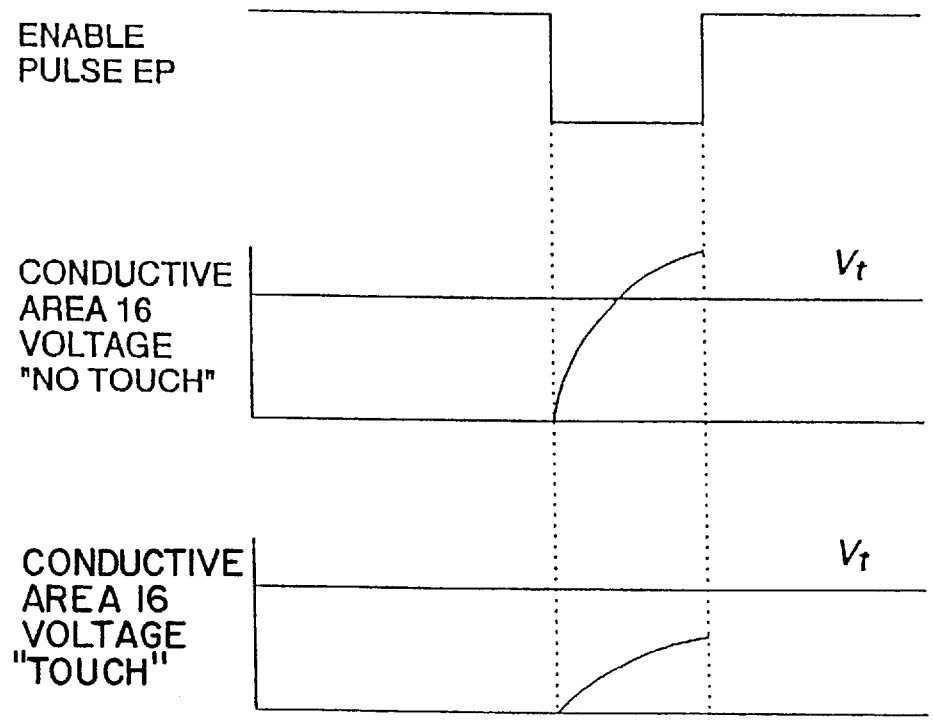
FIG. 4 is a timing diagram of signals in the circuit of FIG. 3.

The operation of the FIG. 3 circuit will be described with reference to the timing diagram of FIG. 4. With no enable pulse EP present (i.e. base of transistor 20 is 'high'), the transistor 20 is on and the voltage at the conductive area 16 is at or near ground potential. The enable pulse EP turns the transistor 20 off, whereby any capacitance effective on the conductive area 16 will cause the voltage to rise exponentially with a time constant determined by the resistor 22 and the value of the capacitance. The threshold circuit 26 is set to detect whether the voltage of the conductive area 16 is greater than a threshold value $V_t$ or not; if the conductive area 16 is not being touched and so the residual (stray) capacitance is low, the voltage will rise above the threshold value $V_t$ within the duration of the enable pulse EP. If the conductive area 16 is being touched, the voltage rise at the conductive area 16 is slowed significantly by the capacitance of the operator 24 and the voltage does not exceed the threshold value $V_t$ within the duration of the enable pulse EP. The threshold circuit 26 and the latch 28 respond to the trailing (rising) edge of the enable pulse EP to cause the latch to be at either logical zero or one, depending on whether or not the value $V_t$ has been exceeded as determined by the threshold circuit 26. The value is then fixed until any subsequent operation produces a changed state, namely either finger contact or finger removal.

It will be clear that the circuit of FIG. 3 is particularly suitable for use in the system of FIG. 1, as well as having the advantage of simple circuit construction. At the end of each enable pulse EP, if the operator is touching the conductive area 16, finger discharging is accomplished very rapidly during the time taken for a subsequent detection circuit to operate after the enable pulse has gone high; this is a result of a very low impedance of the transistor 20 and also due to logic propagation delay. Thus there will be no interaction with a subsequent circuit if the operator should be touching the conductive areas of both circuits. If the touch detection system is provided in an audio mixing console having motorized faders, each fader motor is inhibited if the associated detection circuit (namely, the output of the latch 28) indicates that the fader is being touched.

Figure 5:
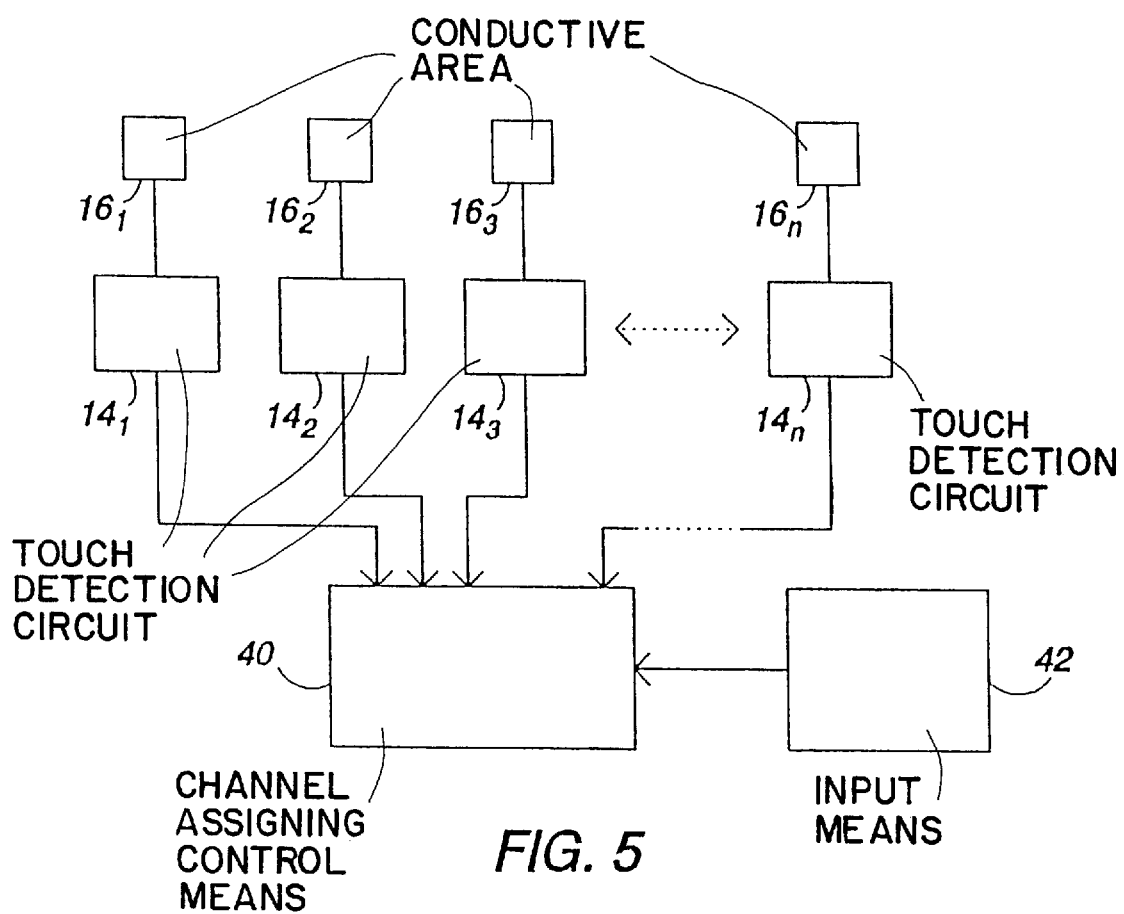
FIG. 5 is a schematic circuit diagram of a touch detection system in a mixing console with assignable controls.

FIG. 5 shows a touch detection system in an audio mixing console with assignable controls. As above, touch detection circuits $14_1$ to $14_n$ have respective conductive areas $16_1$ to $16_n$ which, in an audio mixing console, will be the fader knobs. As described above, assignable controls allow a relatively small number of control knobs (for controlling gain, equalization, audio processing and the like) to control a much larger number of audio channels; typically one set of controls can be used to control up to eight different channels. A channel assigning control means 40 responds to an input means 42, which may be constituted by switches or other controls on the console or by a keyboard, to allow specific ones of the fader knobs and associated controls (not shown) to control particular channels. However, if one of the detection circuits $14_1$ to $14_n$ should determine that its conductive area (on the motorized fader) has been touched, all the other controls associated with that fader such as the equalization control, are immediately assigned to the channel represented by the fader currently being touched by the operator. Thus the channel assign settings entered on the input means 42 are overridden by any fader knob touch contact. This facility can readily be provided on a touch detection system as shown in FIG. 1; the overall system would then be represented by a combination of FIGS. 1 and 5. Also, a touch detection circuit as shown in FIG. 3 can be used for each of the circuits 14 in FIG. 5.

Although illustrative embodiments of the invention have been described in detail herein with reference to the accompanying drawings, it is to be understood that the invention is not limited to those precise embodiments, and that various changed and modifications can be effected therein by one skilled in the art without departing from the scope and spirit of the invention as defined by the appended claims.

We claim:

1. A capacitive touch detection system comprising a plurality of touch detection circuits each associated with a respective conducting area for detection of increased capacitance at the conductive area, wherein each of said touch detection circuits is operable during a predetermined active period, and wherein a timing circuit is provided for generating non-overlapping active periods for each of the touch detection circuits by applying an enable pulse from one of a plurality of pulse generators to one respective one of said plurality of touch detection circuits to define said predetermined active period, and to an input of a next one of said plurality of pulse generators to define a next Predetermined active period to form a cascading touch detection circuit enabling scheme such that no more than one detection circuit is active at any time, thereby minimizing interaction between the detection circuits if more than one conductive area should be touched simultaneously.

2. The system according to claim 1, wherein termination of the enable pulse for one detection circuit causes the pulse generator for the next detection circuit to generate its enable pulse.

3. The system according to claim 1, wherein each touch detection circuit is operable to detect capacitance by charging the conductive area and any item in contact with the area, and determining whether the voltage at the end of the respective active period is below a threshold value.

4. The system according to claim 1, wherein each touch detection circuit comprises a switching means in a conductive path including a resistance and a conductive area across a voltage source, a threshold circuit for determining whether the voltage at the conductive area is below a threshold value, and means for receiving said enable pulse, the switching means being turned off by the enable pulse allowing the voltage at the conductive area to rise during the enable pulse such that, only if the contact area is not being touched, the voltage will rise above the threshold value.

5. A capacitive touch detection circuit comprising a switching means in a conductive path including a resistance and a conductive area across a voltage source, a threshold circuit for determining whether the voltage at the conductive area is below a threshold value, and means for receiving an enable pulse from a pulse generator associated with a prior capacitive touch detection circuit, the switching means being turned off by the enable pulse allowing the voltage at the conductive area to rise during the enable pulse such that, only if the contact area is not being touched, the voltage will rise above the threshold value.

6. The circuit according to claim 5, including a latch circuit for holding a logical value depending on whether or not the threshold value was exceeded during the preceding enable pulse.

* * * * *